(12) United States Patent
Miyazaki et al.

(10) Patent No.: US 7,278,205 B2
(45) Date of Patent: Oct. 9, 2007

(54) MULTILAYER PRINTED WIRING BOARD AND PRODUCTION METHOD THEREFOR

(75) Inventors: Masashi Miyazaki, Nakamuroda Haruna-Machi (JP); Mitsuhiro Takayama, Nakamuroda Haruna-Machi (JP); Tatsuro Sawatari, Nakamuroda Haruna-Machi (JP); Takatoshi Murota, Nakamuroda Haruna-Machi (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 183 days.

(21) Appl. No.: 10/525,037

(22) PCT Filed: Aug. 7, 2003

(86) PCT No.: PCT/JP03/10049

§ 371 (c)(1),
(2), (4) Date: Feb. 18, 2005

(87) PCT Pub. No.: WO2004/017689

PCT Pub. Date: Feb. 26, 2004

(65) Prior Publication Data

US 2006/0016620 A1    Jan. 26, 2006

(30) Foreign Application Priority Data

Aug. 19, 2002 (JP) .............................. 2002-237866

(51) Int. Cl.
*H05K 3/36* (2006.01)

(52) U.S. Cl. .............................. 29/830; 29/846; 29/852

(58) Field of Classification Search .................. 29/830, 29/846, 852
See application file for complete search history.

(56) References Cited

U.S. PATENT DOCUMENTS 6,528,874 B1    3/2003    Iijima et al.

FOREIGN PATENT DOCUMENTS

| EP | 1 093 329 A2 | * | 4/2001 |
| JP | 04-112596 | * | 4/1992 |
| JP | 07-106761 | * | 4/1995 |

(Continued)

OTHER PUBLICATIONS

International Search Report in English mailed Nov. 18, 2003 with copy of Japanese version of International Search Report.

(Continued)

*Primary Examiner*—Carl J. Arbes
(74) *Attorney, Agent, or Firm*—Blank Rome LLP

(57) ABSTRACT

A multilayer printed wiring board (PWB) including via holes with satisfactory quality without defective shapes like swelling or recession on the end faces is provided. The multilayer PWB includes a build-up board of plural insulation layers as the main structure. In each of the insulation layers, via holes (columnar conductors) for electrically connecting between conductor circuits on the base layer or adjacent layers are formed. The via holes are formed by patterning metal foil with conductivity. The height "H" of the via holes (dimension in the thickness direction of the via hole forming layer) depends on the thickness "D" of the original metal foil only. Accordingly, the via holes can be formed without carrying out filling with conductive paste or electrolytic plating. Thus, multilayer PWB having via holes with satisfactory quality without defective shapes like swelling or recession on the end faces can be manufactured.

3 Claims, 11 Drawing Sheets

FOREIGN PATENT DOCUMENTS

| | | | |
|---|---|---|---|
| JP | 07-142863 | * | 6/1995 |
| JP | 07-249864 A | | 9/1995 |
| JP | 10-022639 | * | 1/1998 |
| JP | 11-087921 | * | 3/1999 |
| JP | 11-087922 | * | 3/1999 |
| JP | 11-087923 | * | 3/1999 |
| JP | 11-163207 | | 6/1999 |
| JP | 11-204943 A | | 7/1999 |
| JP | 2001-111189 A | | 4/2001 |
| JP | 2001-189561 A | | 7/2001 |
| JP | 2001-274554 A | | 10/2001 |
| JP | 2001-326459 A | | 11/2001 |
| JP | 2002-141629 A | | 5/2002 |

OTHER PUBLICATIONS

Preliminary Examination Report dated Jul. 20, 2004.
Notice Informing The Applicant Of The communication Of the International Application To the Designated Offices mailed Feb. 26, 2004.
English translation of JP Patent Publication No. 10-022639 to Teiichi et al. Japanese Document Published Jan. 23, 1998.

* cited by examiner

HEAT PRESS

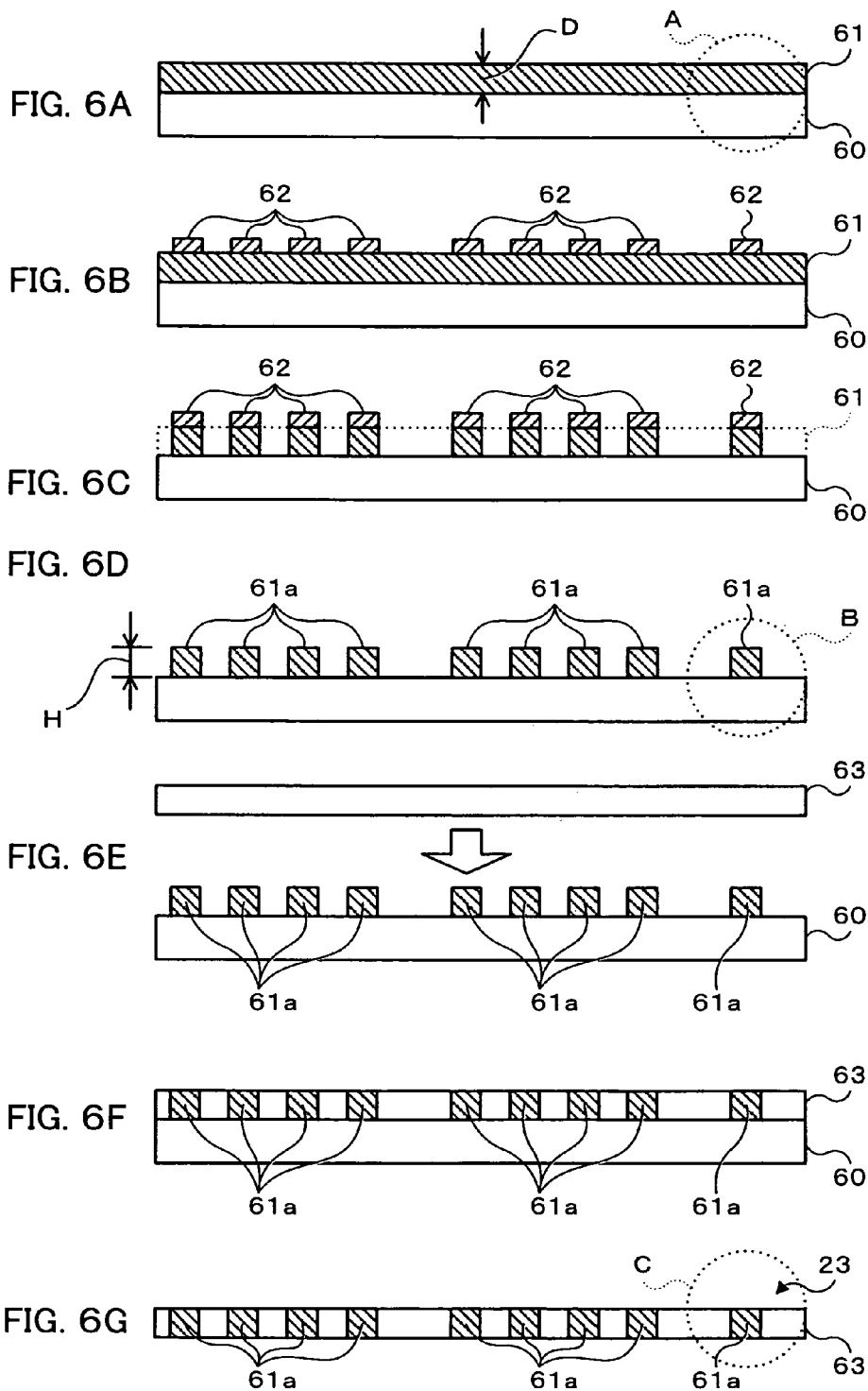

MULTILAYER PRINTED WIRING BOARD AND PRODUCTION METHOD THEREFOR

BACKGROUND OF THE INVENTION

1. Field of the Invention

The present invention relates to a multilayer printed wiring board and production method therefor, more particularly, to a multilayer printed wiring board having a structure of Interstitial Via Hole (hereinafter, referred to as "IVH") and a manufacturing method thereof.

2. Description of the Related Art

A multilayer printed wiring board with a "through hole structure. Specifically, a multilayer printed wiring board with copper foil laminate and prepreg sheet material are integrally stacked one after the other on a build-up board and a plurality of holes (through holes) are formed in the thickness direction of the build-up board. Via the through holes, the front surface side conductor circuits and the rear surface side conductor circuits of a build-up board and/or one or both of the above circuits and conductor circuits on an interlayer within the build-up board are electrically connected. However, there resides the following drawback; i.e., the area for forming the through holes has to be provided, thus this hampers the approach for high density mounting of component parts.

Consequently, a multilayer printed wiring board with IVH structure suitable for high density mounting, particularly a multilayer printed wiring board with any layer IVH structure attracts attention. In the multi layer printed wiring board with any layer IVH structure, in each of the insulation layers constituting a build-up board, via holes are provided for electrically interconnecting between the conductor circuits. That is, in this type of multilayer printed wiring board, interlayer conductor circuits or an interlayer conductor circuit and a front/rear surface conductor circuit are electrically connected therebetween by means of via holes (also named as buried via hole or blind via hole), which do not penetrate the wiring board, and allows flexible layout of electrical connection paths in the interlayer.

FIGS. 10(a)-10(e) show a manufacturing process chart of a conventional IVH structured multilayer printed wiring board (refer to, for example, Japanese Laid-Open Patent Application (Kokai) (A) No. 2000-101248, or Japanese Laid-Open Patent Application (Kokai) (A) No. 2000-183528). In this process, as seen in FIG. 10(a) first of all, a prepreg 1, in which an aramid nonwoven fabric is impregnated with epoxy resin, is drilled to form a predetermined number of holes for via holes 1a, and each of the holes for via holes 1a is filled with conductive paste or electrolytic plating 2. Then, as seen in FIG. 10(b), the both sides of the prepreg 1 are overlapped with copper foils 3, 4 and heat pressed. Thereby, the epoxy resin of the prepreg 1 and the conductive paste or electrolytic plating 2 filled in the hole for via holes 1a come into contact with each other and integrate entirely; and thus, the copper foils 3, 4 on the both sides of the prepreg 1 are electrically connected via the conductive paste or electrolytic plating 2. Then, as seen in FIG. 10(c), the copper foils 3, 4 are subjected to a patterning into a desired configuration. Thus, a hard double-sided substrate 9 is obtained including via holes 7 and 8 (hardened conductive paste or electrolytic plating 2) that electrically connect the conductive circuits 5 and 6 (patterned copper foils 3 and 4) on the both sides.

When the double-sided substrate 9, which is formed as described above, is multilayered as a core layer into, for example, a 4 layered print wiring board, as seen in FIG. 10(d), prepregs 11 filled with conductive paste or electrolytic plating 10 are positioned and built up in order on both sides of the double-sided substrate 9.

However, as the above-described conventional art, when the conductive paste or electrolytic plating 2 is used as filling material of the holes for via holes 1a, there may be a case where the amount of filling of the conductive paste or electrolytic plating 2 in each of the holes for via holes 1a is different. Therefore, for example, as shown in FIG. 11(a), when the amount of filling is too much, a swell 17 is generated on the exposed surfaces of the via hole 16 formed in the prepreg 15. Or, as shown in FIG. 11(b), when the amount of filling is short, a recession 18 is generated on the exposed surface of the via holes 16. As a result, there resides such a problem that, when the adjacent layers are built up and heat pressed, due to the influence of the swell 17 or the recession 18, the thickness of the adjacent layers (thickness of insulation film) is undesirably changed. Needless to say, when the amount of filling is precisely controlled, such disadvantage is not caused. However, precise control of the amount of filling leads to an increase of the management man-hour in the manufacturing process resulting in an increase of manufacturing cost.

SUMMARY OF THE INVENTION

An object of the present invention is to provide a multilayer printed wiring board, which allows forming via holes without carrying out filling with conductive paste or electrolytic plating, and includes via holes with quality free from defective shapes such as swelling or recession on the end faces, and manufacturing method thereof.

The multilayer printed wiring board of the present invention is characterized by comprising a multilayer printed wiring board with an Interstitial Via Hole (IVH) structure in which the main structure is a build-up type board composed of a plurality of insulating layers and provided with via holes which electrically interconnect between a conductor circuit of a base layer or adjacent layers in each of the insulating layers; and the via holes are formed by patterning metallic foil which is electrically conductive.

In the multilayer printed wiring board of the present invention, the insulation layers are formed with a resin material and the via holes at least undergo roughening treatment of the surface in contact with the resin material.

In the multilayer printed wiring board of the present invention, the via holes at least undergo a coating treatment of the surfaces adjoining the conductor circuit in adjacent layers with low-temperature diffusion metal.

A manufacturing method of a multilayer printed wiring board is characterized in which at the time of manufacturing each layer of a build-up board composed of a multilayer printed wiring board with an Interstitial Via Hole (IVH) structure includes a first process step which bonds a metallic foil having electrical conductivity on one side of a sheet-like support substrate and supports possible exfoliation; a second process step which forms metallic conductor pieces for the via holes and patterns the metallic foil after the first process; a third process step which transfers the metallic conductor pieces to sheet-like insulating resin after the second process; and a fourth process step which exfoliates the support substrate after the third process.

The manufacturing method of a multi layer printed wiring board of the present invention includes a fifth process step in which roughening treatment is performed on the surface of at least the metallic conductor pieces in contact with the insulating resin.

The manufacturing method of a multilayer printed wiring board of the present invention includes a sixth process step in which coating treatment is performed on the metal conductor pieces with low-temperature diffusion metal.

According to the present invention, the via holes are formed by patterning the metal foil having the conductivity. Accordingly, the height of the via holes (dimension in the thickness direction of the via hole forming layer) depends on the thickness of the original metal foil. Therefore, the via holes can be formed without filling with conductive paste or electrolytic plating. Thus, the multilayer printed wiring board having via holes of satisfactory quality free from defective shapes such as swelling or recession on the end faces.

Also, according to the preferred mode of the present invention, the surface abutting on the resin material of the via holes is roughened (processing to form minute concavities and convexities). The contact area of the surface is increased and the junction with the resin material is ensured. Thus, disadvantages such as peel-off can be avoided resulting in an increased reliability.

Further, according to the preferred mode of the present invention, a predetermined surface of the via holes (surface abutting on the conductor circuits of the adjacent layers) is coated with a low temperature diffusion metal. Accordingly, the softening of the surface during heat press is promoted and the junction between the via holes and the conductor circuits of the adjacent layers is ensured. Thus, disadvantages such as peel-off can be avoided resulting in an increased reliability.

BRIEF DESCRIPTION OF THE DRAWINGS

FIGS. 6(a)-6(g) illustrate a manufacturing process of a junction substrate 23 (a first junction substrate 23, a second junction substrate 23);

FIG. 11 shows

DETAILED DESCRIPTION OF THE PREFERRED EMBODIMENTS

The present invention will be explained in detail with reference to the drawings.

Figure 1:
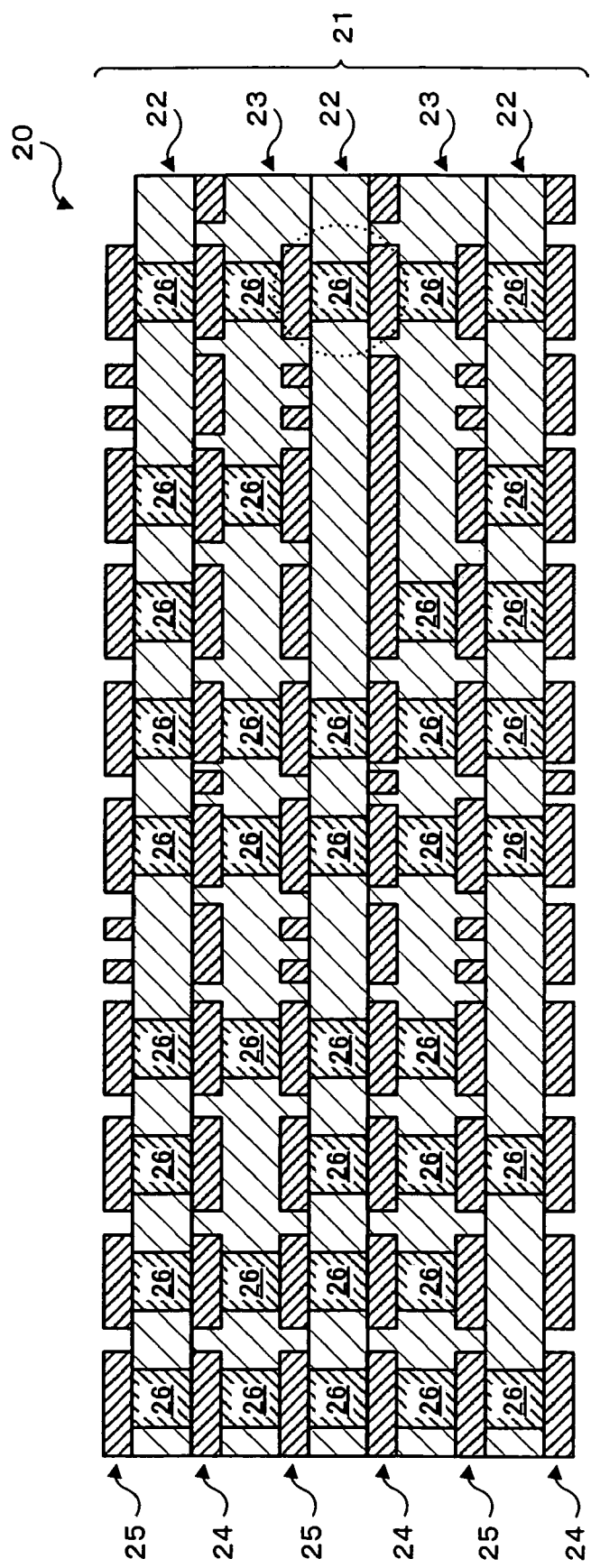
FIG. 1 shows a sectional structure of a multilayer printed wiring board manufactured by applying a concept of the present invention.
Figure 2:
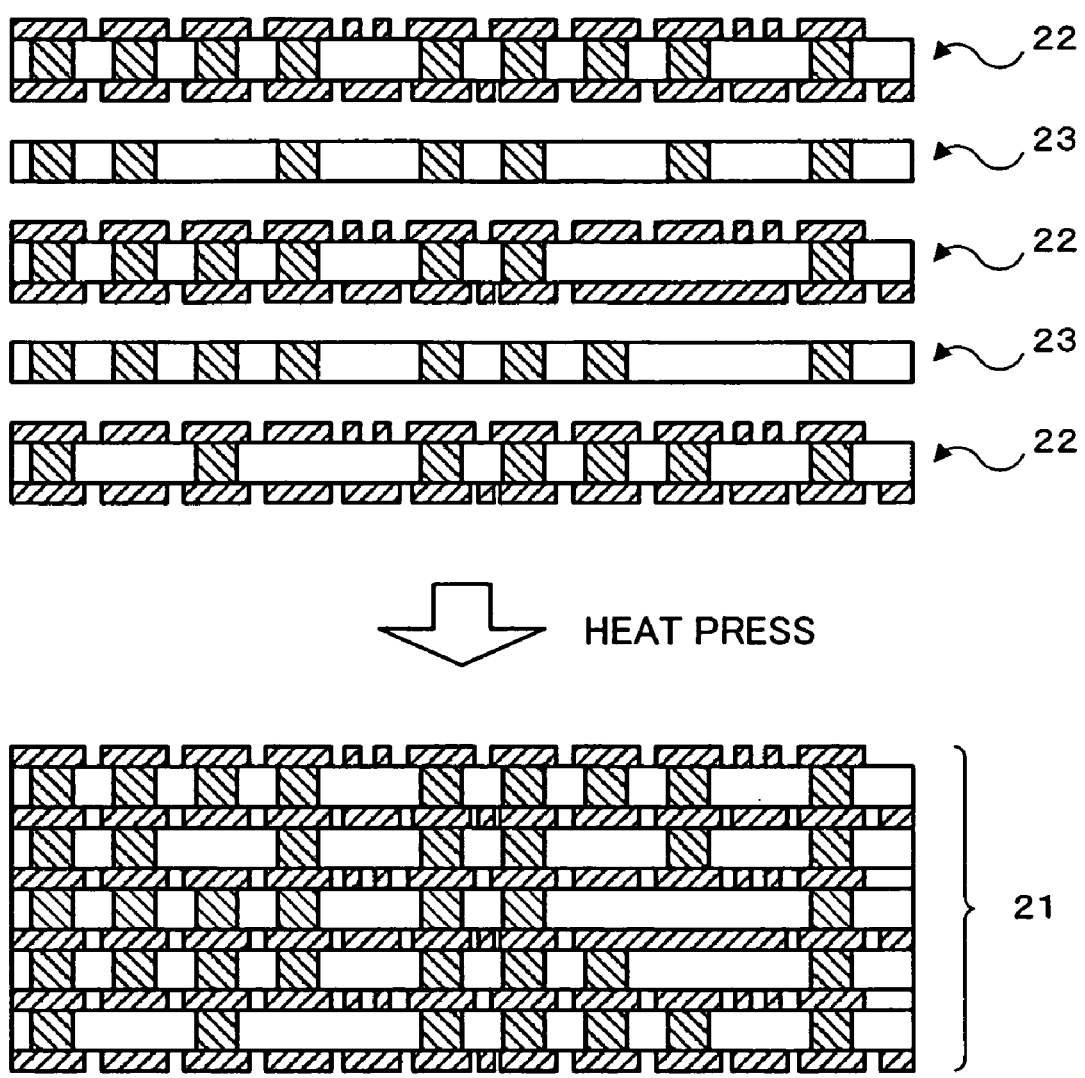
FIG. 2 shows a status of a stacked-layer of the multilayer printed wiring board manufactured by applying the concept of the present invention.

FIG. 1 shows a sectional structure of a multilayer printed wiring board manufactured by applying a concept of the present invention; and FIG. 2 shows a status of a stacked-layer thereof. In FIG. 1, a multilayer printed wiring board 20 has a build-up board 21 (including a conductive layer on the front surface layer) of n-layered structure (n is not particularly limited; but it is assumed that n=5 for convenience) as a main structure body. Each layer of the build-up board 21 is a double-sided substrate 22 having conductive circuits on both surfaces and a junction substrate 23 for joining the double-sided substrates 22 to each other. That is, in an example of the structure shown in FIG. 1, from the lower layer to the upper layer, a double-sided substrate 22, a junction substrate 23, a double-sided substrate 22, a junction substrate 23, and a double-sided substrate 22 are built up one after the other in this order. And an integrated build-up board 21 is obtained by subjecting the above to a heat press process (refer to FIG. 2).

Hereinafter, for the convenience of explanation, the double-sided substrate 22 at the lowermost layer will be referred to as the "first double-sided substrate 22"; likewise, the junction substrate 23 thereon will be referred to as the "first junction substrate 23"; the double-sided substrate 22 as an intermediate layer will be referred to as the "second double-sided substrate 22"; the junction substrate 23 thereon will be referred to as the "second junction substrate 23"; and the double-sided substrate 22 at the uppermost layer will be referred to as the "third double-sided substrate 22".

On the front and rear surfaces of the first to third double-sided substrates 22, lower face side conductor circuits 24 and upper face side conductor circuits 25, each of which is patterned to a desired configuration respectively, are formed. In the case where a double-sided substrate 22 and a junction substrate 23 are in contact with each other, the conductor circuits 24 and 25, which are located between the contact faces thereof, are embedded in the neighboring junction substrates 23. The reason of the above is as described below. That is, as the main material for the junction substrates 23, an insulating material, which has flexibility such as a material of thermosetting type; for example, an epoxy resin, a cyanate ester resin, a polyphenylene ether resin, benzo cyclobutene resin, polyimide resin, etc. is used, and a heat press is carried out after stacking the layers in the above-described order and the conductor circuits 24 and 25 located between the contact faces enter (embedded) into the neighboring junction substrates 23. Further, the material for the junction substrates 23 is not limited to a thermosetting type insulating material. If the conductor circuits 24 and 25 located between the contact faces are embedded into the neighboring junction substrates 23, a thermoplastic insulating material may be employed.

In the first to third double-sided substrates 22 and in the first and second junction substrates 23, a desired number of via holes 26 are formed. Each of the via holes 26 ensures electrical connection between the conductor circuits 24 and 25 on one layer adjacent to the base layer and the conductor circuits 24 and 25 on the other layer. For example, a via hole 26 (refer to a via hole 26 encircled with a dot line), which is formed at the right-end of the second double-sided substrate 22, ensures the electrical connection between one of the lower face side conductor circuits 25 on the second junction substrate 23 at the upper layer thereof and one of the upper face side conductor circuits 24 of the first junction substrate 23 at the lower layer thereof.

Conventionally, the wording "via hole" is generally understood as an electrical connection path constituted of a hole formed in each of the layers of a build-up board which is "filled with" conductive paste or electrolytic plating and "hardened" by means of a heat treatment or the like. As will be clarified by the following description, the via holes 26 according to the embodiment of the present invention is different from the via hole based on the above described conventional understanding in a point that the processes of "filling with" and the "hardening" are not required.

Hereinafter, in order to clarify the above point, description will be made further in detail.

FIGS. 3(a)-3(e) and FIGS. 4(a)-4(e) are manufacturing process charts of the double-sided substrate 22 (the first double-sided substrate 22 to the third double-sided substrate 22).

Figure 3A:
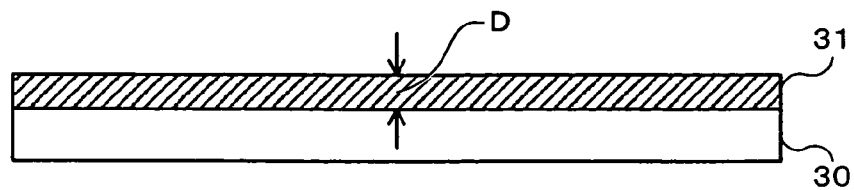
FIGS. 3(a)-3(e) illustrate a manufacturing process of double-sided substrates 22 (a first double-sided substrate 22 to a third double-sided substrate 22) (part 1)

The process in FIG. 3(a): first of all, a sheet-like supporter 30, which can be peeled off, is prepared. On one surface of the supporter 30 (in FIG. 3(a), upper surface), metal foil (for example, copper foil) 31 of good conductivity is laminated. For the supporter 30, for example, a circuit forming transfer sheet manufactured by SEKISUI CHEMICAL CO., LTD. may be employed.

Here, assuming that the design height of the via holes 26 to be formed on the double-sided substrate 22 is "H", the thickness "D" of the metal foil 31 has a value equal to "H". That is, D=H. Accordingly, for example, when via holes of H=18 µm are formed, metal foil 31 of D=18 µm is laminated on the supporter 30.

Figure 3B:
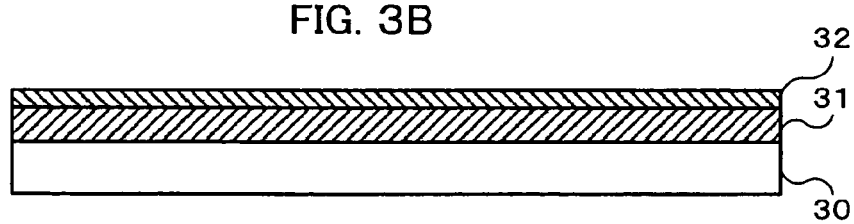

A process in FIG. 3(b): then, the entire surface of the metal foil 31 is coated with a photosensitive resist 32.

Figure 3C:
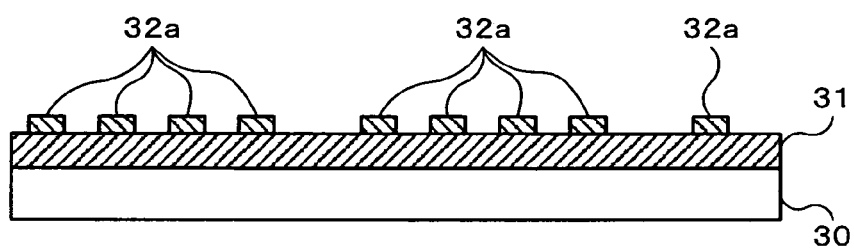

A process in FIG. 3(c): then, exposure and development are carried out according to the forming pattern of the via holes, and unnecessary portions of the photosensitive resist 32 is removed to form etching resists 32a for forming via holes.

Figure 3D:
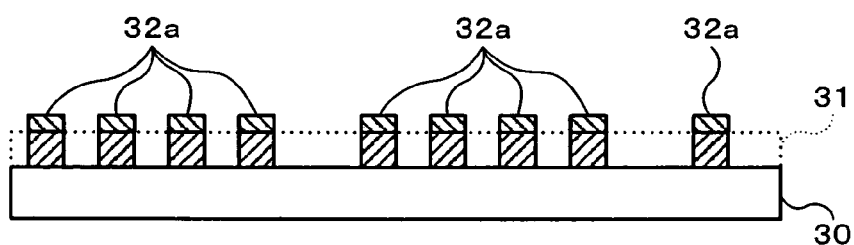
Figure 3E:
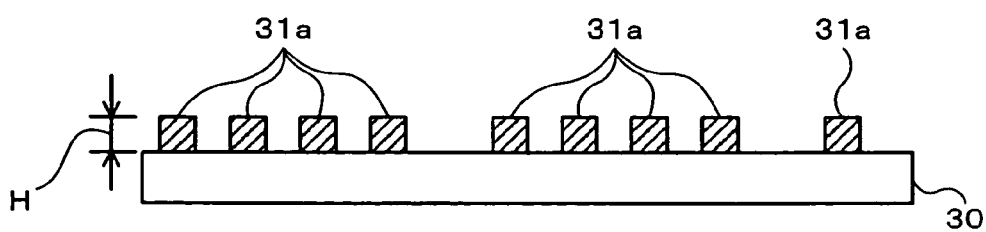

Processes in FIGS. 3(d) and 3(e): then, after carrying out etching selectively on the metal foil 31 (etching on the portion where is not coated with the etching resists 32a), unnecessary etching resists 32a are removed. Thereby, as shown in FIG. 3(e), the metal foil 31 is patterned to a desired configuration and a plurality of columnar metal conductor pieces (hereinafter, referred to as "columnar conductor") 31a are left on the supporter 30. Being originally formed of the metal foil 31, needless to say, these columnar conductors 31a have good electrical conductivity and have a height H equal to the thickness D of the metal foil 31.

Figure 4A:
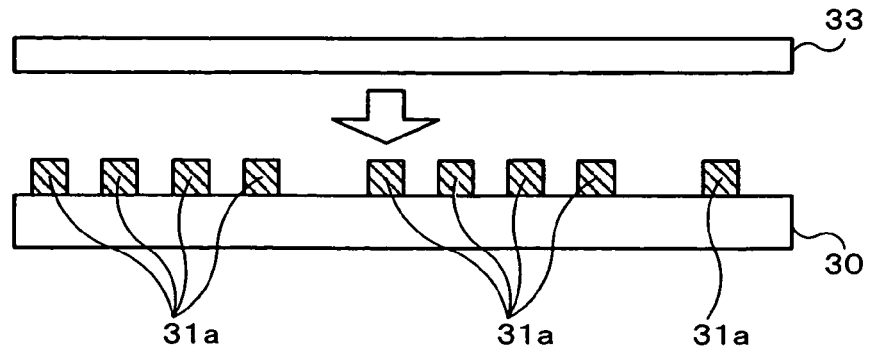
FIGS. 4(a)-4(e) illustrate a manufacturing process of the double-sided substrates 22 (the first double-sided substrate 22 to the third double-sided substrate 22) (part 2)
Figure 4B:
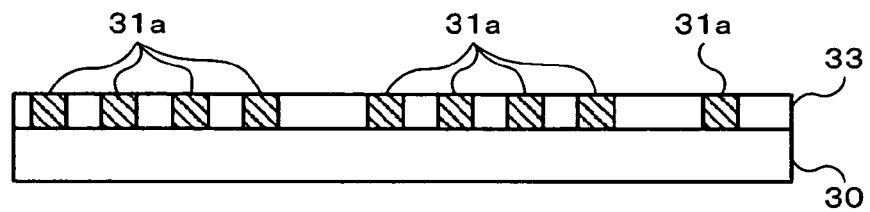

Processes in FIGS. 4(a) and 4(b): then, one surface of the supporter 30 (the surface having columnar conductors 31a) is laminated with a softened sheet-like insulation resin (resin material) 33 by pressure. Thereby, as shown in FIG. 4(b), the columnar conductors 31a formed on one surface of the supporter 30 enters (embedded) into the sheet-like insulation resin 33; and a state where the columnar conductors 31a are "transferred" to the sheet-like insulation resin 33 is obtained.

Figure 4C:
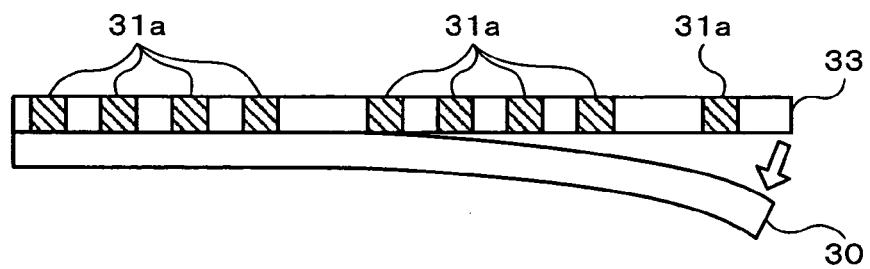

A process in FIG. 4(c): then, the supporter 30, which becomes unnecessary by the above-mentioned transfer, is peeled off.

Figure 4D:
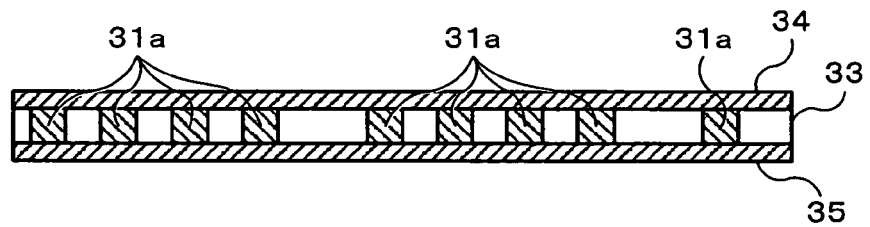

A process in FIG. 4(d): then, on both side surfaces of the sheet-like insulation resin 33, metal foils 34 and 35 for conductor circuits (preferably, well-conductivity metal foil such as copper foil) are placed and heat pressed to integrate with each other.

Figure 4E:
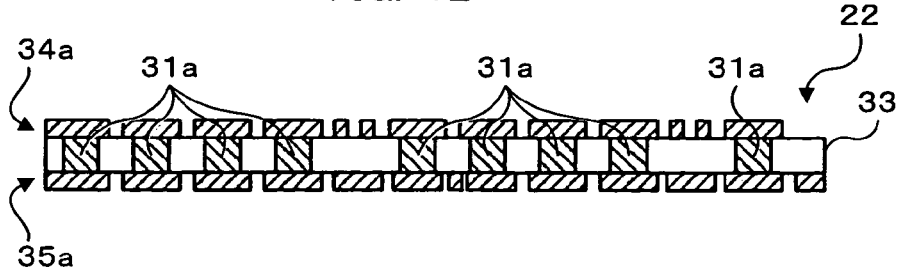

A process in FIG. 4(e): finally, each of the metal foils 34 and 35 for conductor circuits is patterned in accordance with a predetermined conductor circuit pattern to form a desired upper face side conductor circuit 34a and a lower face side conductor circuit 35a. Thus, one double-sided substrate 22 is obtained.

When these double-sided substrates 22 are used as the first double-sided substrate 22 to the third double-sided substrate 22 in FIG. 1, the upper face side conductor circuit 34a and the lower face side conductor circuit 35a become the upper face side conductor circuit 25 and the lower face side conductor circuit 24 respectively of the first double-sided substrate 22 to the third double-sided substrate 22 in FIG. 1. Also, the columnar conductors 31a transferred to the sheet-like insulation resin 33 become the via holes 26 in the first double-sided substrate 22 to the third double-sided substrate 22 in FIG. 1.

As demonstrated in the above description, in this embodiment, the via holes 26 in the first double-sided substrate 22 to the third double-sided substrate 22 are the columnar conductors 31a themselves that are transferred to the sheet-like insulation resin 33. Since these columnar conductors 31a are the patterned metal foil 31, the columnar conductors 31a have electrical well conductivity, and the height "H" of the columnar conductors 31a are equal to the thickness "D" of the metal foil 31.

Figure 11A:
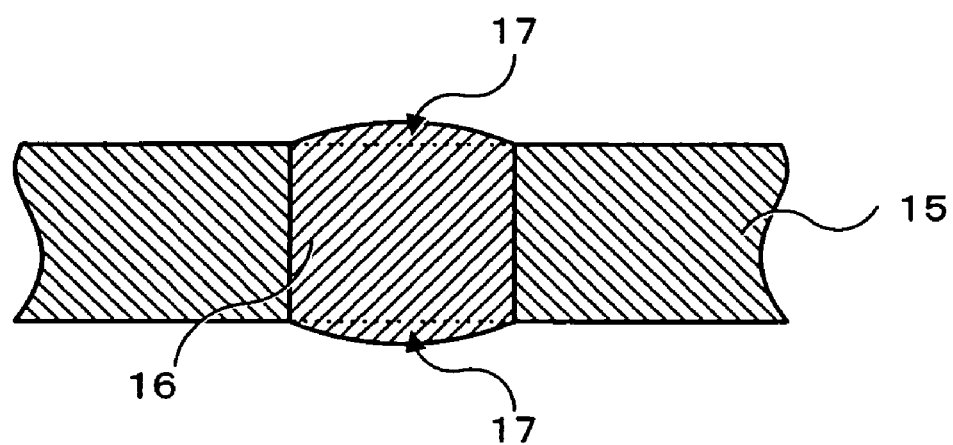
FIGS. 11(a)-11(b) show problems in a conventional art.
Figure 11B:
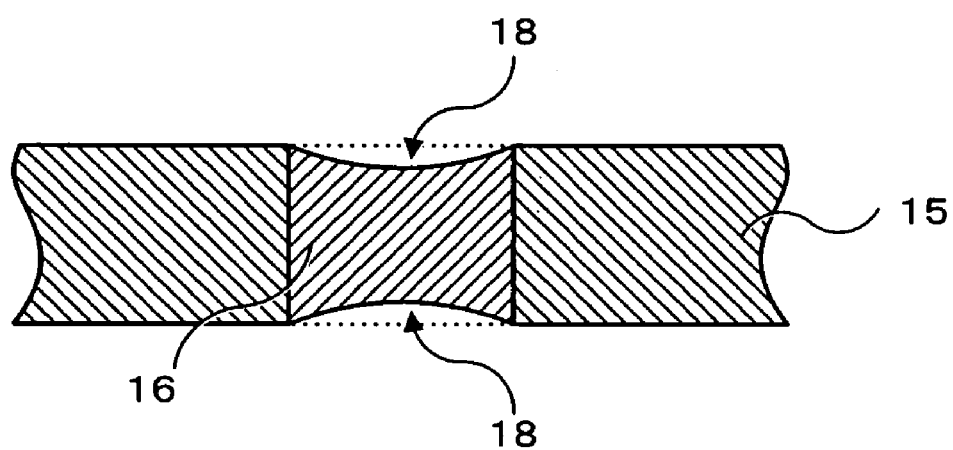

Accordingly, since the processes such as "filling" and "hardening" are not required, the via holes 26 according to this embodiment are free from, for example, defective shapes such as the uneven height of the via holes due to shortage or excess in filling amount. Thus, the following particular effect is obtained; i.e., the drawback of the via holes in the conventional art (refer to the via hole 16 in FIG. 11) is eliminated.

In the manufacturing processes, in the step of process in FIG. 4(d), the both side surfaces of the sheet-like insulation resin 33 is laminated with metal foils 34 and 35 for conductor circuits respectively. However, the present embodiment is not limited to the above. For example, the processes in FIGS. 4(a) to (d) may be modified as described below.

FIG. 5 shows a manufacturing process chart of the double-sided substrate 22 (the first double-sided substrate 22 to the third double-sided substrate 22), which may be replaced with the processes in FIGS. 4(a) to 4(d).

Figure 5A:
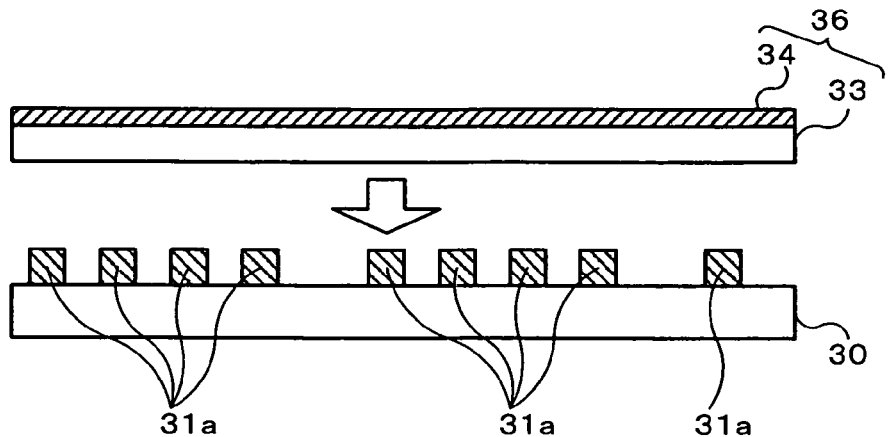
FIGS. 5(a)-5(d) illustrate a manufacturing process of the double-sided substrates 22 (the first double-sided substrate 22 to the third double-sided substrate 22) which may be replaced with the process shown in FIG. 4(a) to FIG. 4(d)
Figure 5B:
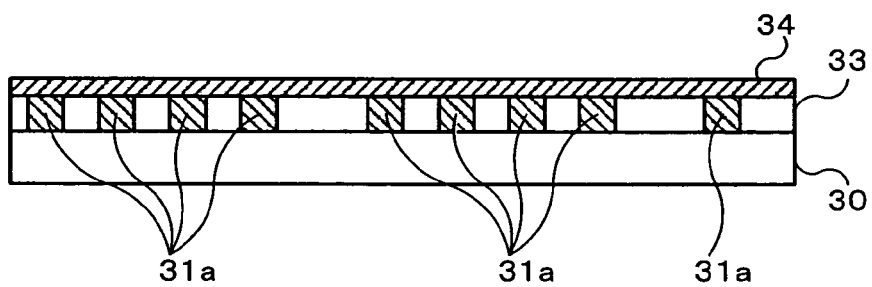

Processes in FIGS. 5(a) and 5(b): first of all, one side surface of the supporter 30 (the surface having the columnar conductors 31a) is laminated with metal foil 36 with resin (softened sheet-like insulation resin 33 to which the metal foil 34 conductor circuit is placed before hand) with pressure. Thereby, as shown in FIG. 5(b), the columnar conductors 31a formed on one surface of the supporter 30 enters (embedded) into the sheet-like insulation resin 33, and a state where the columnar conductors 31a are "transferred" to the sheet-like insulation resin 33 is obtained.

Figure 5C:
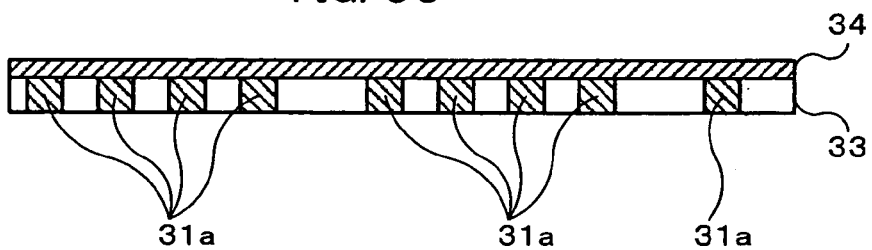
Figure 5D:
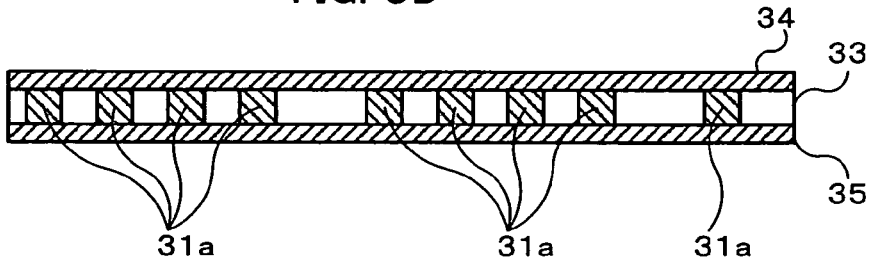

A process in FIG. 5(c): then, after peeling off the supporter 30, which becomes unnecessary due to the above-described transfer, on the bottom surface of the sheet-like insulation resin 33, the metal foil 35 for conductor circuits is pasted and heat pressed to integrate with each other (FIG. 5(d)).

Even in such manner as described above, the double-sided substrate 22 having the structure in which both surfaces of the sheet-like insulation resin 33 is laminated with metal foils 34 and 35 for conductor circuits is obtained.

Then, the manufacturing process of the junction substrate 23 will be described. Basically, this manufacturing process is also the same as that of the double-sided substrate 22. The essential point of this process is that the via holes can be formed without requiring the processes of "filling" or "hardening".

FIG. 6 is a manufacturing process chart of the junction substrate 23 (the first junction substrate 23 and the second junction substrate 23).

A process in FIG. 6(a): first of all, a sheet-like supporter 60, which is the same as the above-described supporter 30 and can be peeled off, is prepared. On one surface of the supporter 60 (upper surface in FIG. 6(a)), metal foil (for example, copper foil) 61 of good conductivity is placed. Same as the case of the double-sided substrate 22, assuming that the design height of the via holes 26 formed in the junction substrate 23 is "H", the thickness "D" of the metal foil 61 has a value equal to the "H". That is, D=H. Accordingly, for example, when forming via holes of H=18 μm, metal foil 61 of D=18 μm is laminated on the supporter 60.

A process in FIG. 6(b): then, an etching resist 62 for forming via holes is formed on the surface of the metal foil 61.

Processes in FIGS. 6(c) and 6(d): then, after selectively etching on the metal foil 61 (etching on portion where is not coated with the etching resist 62), unnecessary etching resist 62 is removed. Thereby, as shown in FIG. 6(d), a part of the metal foil 61 is patterned, and on the supporter 60, a plurality of columnar metal conductor pieces (hereinafter, referred to as "columnar conductors") 61a are left. Originally, these columnar conductors 61a are formed of the metal foil 61. Needless to say, the columnar conductors 61a have good electrical conductivity, and have the height "H" equal to the thickness "D" of the metal foil 61.

Processes in FIGS. 6(e) and 6(f): then, one surface of the supporter 60 (the surface having columnar conductors 61a) is laminated with a softened sheet-like insulation resin (resin material) 63 by pressure. Thereby, as shown in FIG. 6(f), the columnar conductors 61a formed on one surface of the supporter 60 enters (embedded) into the sheet-like insulation resin 63; and a state where the columnar conductors 61a are "transferred" to the sheet-like insulation resin 63 is obtained.

A process in FIG. 6(g): finally, the supporter 60, which becomes unnecessary to the above-mentioned transfer, is peeled off. Thus, one junction substrate 23 is obtained.

When this junction substrate 23 is applied to the first junction substrate 23 and the second junction substrate 23 in FIG. 1, the columnar conductors 61a transferred to the sheet-like insulation resin 63 become the respective via holes 26 in the first junction substrate 23 and the second junction substrate 23 in FIG. 1.

As demonstrated in the above description, also in this embodiment, the via holes 26 in the first junction substrate 23 and the second junction substrate 23 are the columnar conductors 61a themselves transferred to the sheet-like insulation resin 63. Since these columnar conductors 61a are the patterned metal foil 61, the columnar conductors 61a have good electrical conductivity, and the height "H" of the columnar conductors 61a are equal to the thickness "D" of the metal foil 61.

Accordingly, since the processes such as "filling" and "hardening" are not required, the via holes 26 in the first junction substrate 23 and the second junction substrate 23 are also free from, for example, defective shapes such as uneven height of the via holes due to shortage or excess in filling amount. Thus the following particular effect is obtained; i.e., the drawback of the via holes in the conventional art (refer to the via hole 16 in FIG. 11) is eliminated.

The present invention is not limited to the above embodiment. Needless to say, various modifications within the scope of the concept of the invention should be included in the present invention.

Figure 7A:
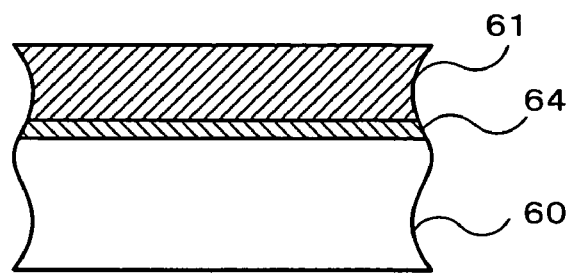
FIGS. 7(a)-7(c) show an example of a modification of an essential process of the multilayer printed wiring board manufactured by applying the concept of the present invention.
Figure 7B:
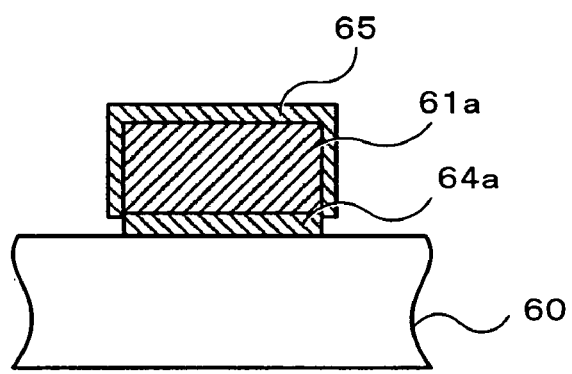
Figure 7C:
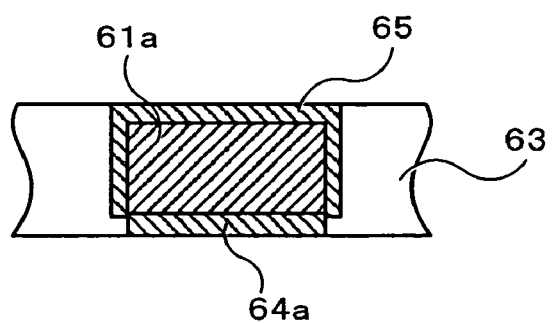

FIGS. 7(a)-7(c) show an essential process of an example of a modification. FIG. 7(a) is an enlarged view of a portion "A" in FIG. 6(a); FIG. 7(b) is an enlarged view of a portion "B" in FIG. 6(d); and FIG. 7(c) is an enlarged view of a portion "C" in FIG. 6(e). Referring to FIG. 7(a), in this modification, when laminating the metal foil 61 of wellconductivity on one surface of the supporter 60, an intermediate layer 64 formed of a low temperature diffusion metal (for example, tin and the like) is interposed between the supporter 60 and the metal foil 61. Then, as shown in FIG. 7(b), when selectively etching the metal foil 61 (process in FIG. 6(c)) to form the columnar conductor 61a, the intermediate layer 64 is also etched simultaneously to form a bottom face coating portion 64a coating the bottom face of the columnar conductors 61a. Then, uncoated surfaces (side surfaces and upper surface) of the columnar conductors 61a are coated with the same metal material as the intermediate layer 64 (low temperature diffusion metal such as tin) 65. Then, as shown in FIG. 7(c), by "transferring" the columnar conductors 61a to the sheet-like insulation resin 63 (process in FIG. 6(e)), the columnar conductor 61a of which periphery are coated with low temperature diffusion metal (64a, 65) can be embedded in the sheet-like insulation resin 63.

As a result, at least both end faces (front and rear side faces of the junction substrate 23) of the columnar conductors 61a, which functions as the via hole 26, are coated with the low temperature diffusion metal (64a, 65). Accordingly, the following merit is obtained; i.e., the junction performance between the conductor circuits (the lower face side conductor circuit 24 and the upper face side conductor circuit 25) on the double-sided substrates 22 adjacent to the junction substrate 23 and the via holes 26 in the junction substrate 23 is increased.

Figure 8A:
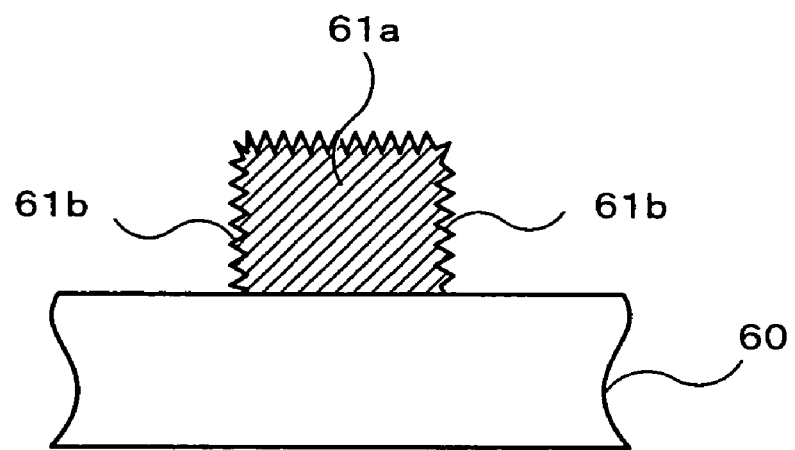
FIGS. 8(a)-8(b) show another example of a modification of an essential process of the multilayer printed wiring board manufactured by applying the concept of the present invention.
Figure 8B:
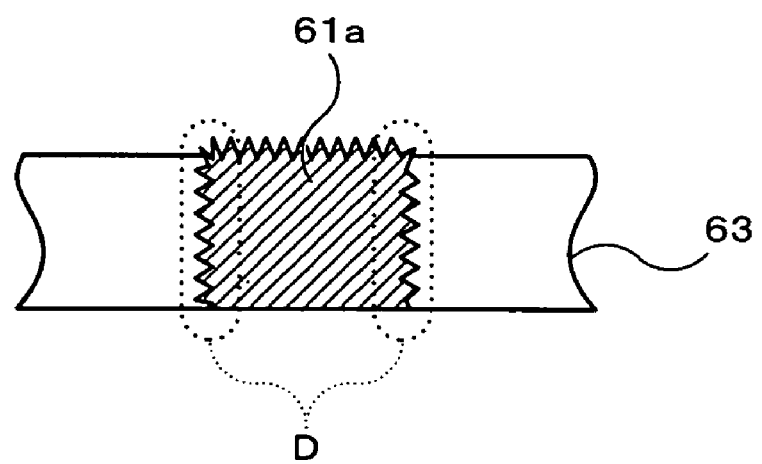

FIGS. 8(a)-8(b) show an essential process of another example of the modification; FIG. 8(a) is an enlarged view of a portion "B" in FIG. 6(d); and FIG. 8(b) is an enlarged view of a portion "C" in FIG. 6(e). Referring to FIG. 8(a), the essential point of this modification is to carry out "roughening process" as described below. That is, after selectively etching the metal foil 61 (process in FIG. 6(c)) to form the columnar conductors 61a, minute concavities and convexities 61b are formed on the surface of the columnar conductors 61a (in FIG. 8(a), on the upper surface and the side surface; but at least, on the side surface).

Consequently, as shown in FIG. 8(b), when the columnar conductors 61a are embedded in the sheet-like insulation resin 63, the sheet-like insulation resin 63 and the columnar conductors 61a are in contact with each other (refer to portions indicated with reference symbol "D" in FIG. 8(b)) via the concavities and convexities 61b on the side surface of the columnar conductors 61a. Due to these concavities and convexities 61b, the substantial contact area of the both sides is enlarged and the junction strength between the sheet-like insulation resin 63 and the columnar conductors 61a are increased. As a result, disadvantages such as peeling-off can be avoided resulting in an increased reliability.

Figure 9A:
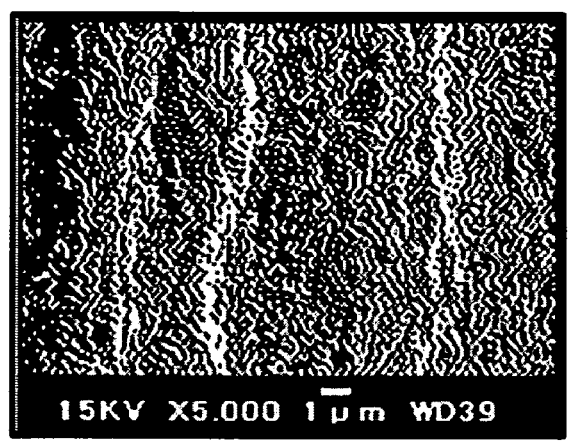
FIGS. 9(a)-9(b) show photographs of the surface of a columnar conductor 61a for comparing the surface before a roughening process (a) and after a roughening process (b)
Figure 9B:
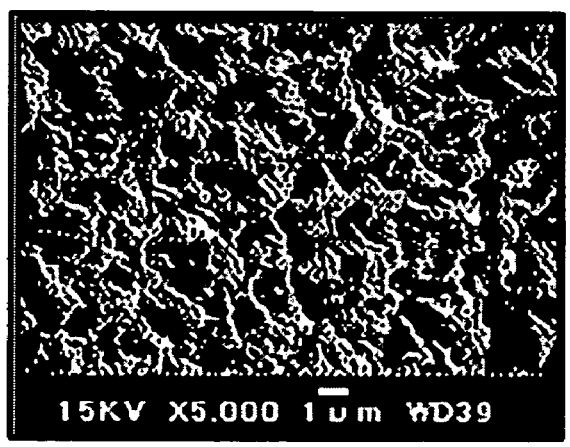
Figure 10A:
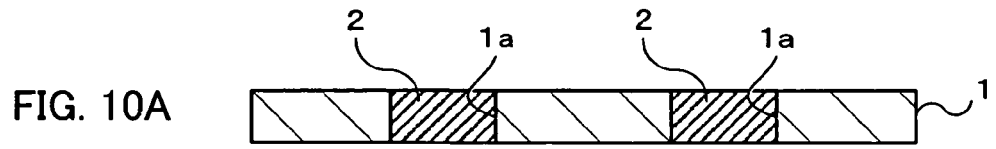
FIGS. 10(a)-10(e) show a manufacturing process of a conventional IVH structured as a multilayer printed wiring board.
Figure 10B:
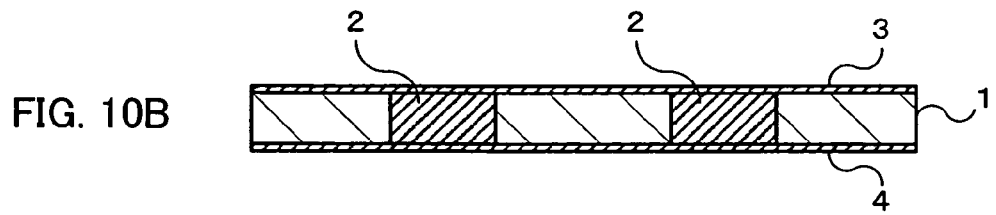
Figure 10C:
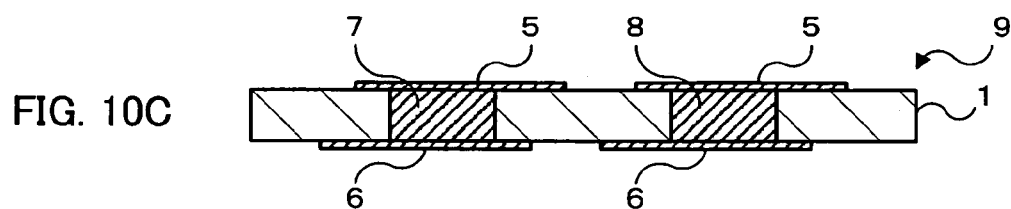
Figure 10D:
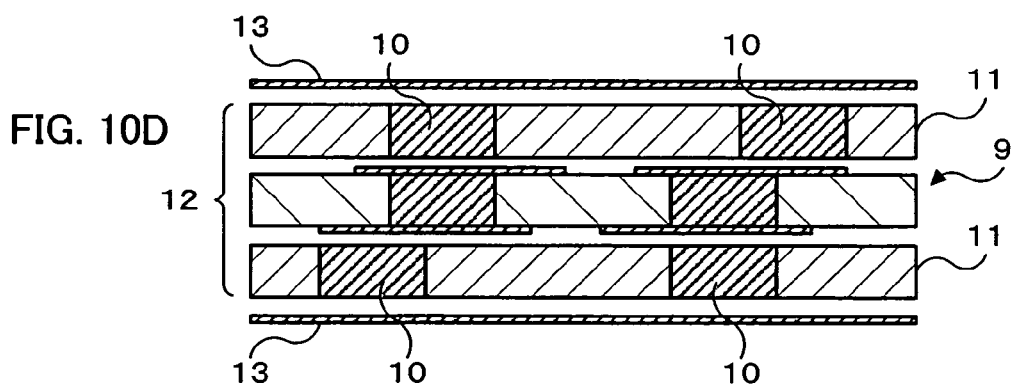
Figure 10E:
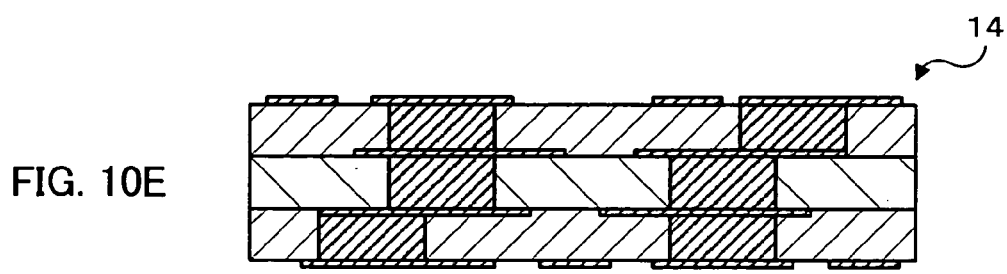

FIGS. 9(a)-9(b) show photographs of the surface of the columnar conductor 61a for comparing the states before the roughening process (FIG. 9(a)) and after the roughening process (FIG. 9(b)). These photographs were taken using an SEM (scanning electron microscope). The photographing conditions in both pictures were 15 KV (impressed voltage), ×5000(magnifications). Comparing them both, in the case of (a), only smooth waves, which are minute to a negligible level can be seen; in the case of (b), the entire surface is filled with minute concavities and convexities, which are repeated at substantially regular intervals. Obviously, in the case of (b), effect of the surface roughening can be recognized.

In this modification, the example, in which the columnar conductor 61*a* of the junction substrate 23 is roughened, has been described. However, the present invention is not limited to the above. The columnar conductors 31*a* on the double-sided substrates 22 maybe roughened. Further, as another modification, when laminating the metal foil 61 of good conductivity on one surface of the supporter 60, an intermediate layer 64 of low temperature diffusion metal (for example, tin or the like) is interposed between the supporter 60 and the metal foil 61. And, as shown in FIG. 7(*b*), when selectively etching the metal foil 61 (process in FIG. 6(*c*)) to form the columnar conductor 61*a*, the intermediate layer 64 is also etched simultaneously to form the bottom face coating portion 64*a* coating the bottom face of the columnar conductor 61*a*. Then, after forming the columnar conductor 61*a*, the "roughening process", in which minute concavities and convexities 61*b* are formed on the surface of the columnar conductor 61*a*, is carried out. Then, the uncoated surface (side surface and upper surface) of the columnar conductor 61*a* is coated with the same metal material (low temperature diffusion metal such as tin) 65 as that of the intermediate layer 64. And, as shown in FIG. 7(*c*), the columnar conductor 61*a* is "transferred" to the sheet-like insulation resin 63 (process in FIG. 6(*e*)). Thus, columnar conductors 61*a* of which periphery is coated with the low temperature diffusion metal (64*a*, 65) can be embedded in the sheet-like insulation resin 63.

Further, as another modification, for example, if necessary, the front and rear surfaces of the columnar conductors 31*a* may be cleaned using permanganic acid or a laser before forming sheet layer in FIG. 4(*d*). Or, when forming the junction substrate 23, after transferring the columnar conductor 61*a* to the sheet-like insulation resin 63, the surface of the columnar conductor 61*a* may be cleaned using a laser, etc.

INDUSTRIAL APPLICABILITY

As described above, according to the present invention, the multilayer printed wiring board and the manufacturing method thereof are suitable to be used for high density mounting of electronic parts.

For example, the multilayer printed wiring board and the manufacturing method thereof may be applied to electronic parts, semiconductor chips, printed boards, electronic circuits, modules which are a kind of units or component parts, particularly to modules in which one or a plurality of semiconductor chips, resister devices, capacitive elements or other electronic parts are mounted to achieve an intended electronic circuit function. Such modules may be applied, for example, to electronic devices, mobile phones, and mobile information terminals. Further, the present invention is not limited to the above, but may be widely applied to electronic parts employing multilayer printed wiring boards and manufacturing methods thereof capable of utilizing the effects of the present invention.

The present invention is suitable for high density mounting of component parts and is capable of readily achieving the miniaturization of electronic devices and high-speed signal transmission.

What is claimed is:

1. A manufacturing method of a multilayer printed wiring board in which at the time of manufacturing each layer of a build-up board composed of a multilayer printed wiring board with an Interstitial Via Hole (IVH) structure comprising the steps of:

bonding a metallic foil having electrical conductivity on one side of a sheet-like support substrate wherein said support substrate supports said metallic foil;

after bonding, forming metallic conductor pieces for said via holes by patterning said metallic foil;

transferring said metallic conductor pieces to a sheet-like insulating resin by laminating said metallic conductor pieces with said sheet-like insulating resin; and exfoliating said support substrate.

2. The manufacturing method of a multilayer printed wiring board according to claim 1, further comprising roughening at least the surface of said metallic conductor pieces in contact with said insulating resin.

3. The manufacturing method of a multilayer printed wiring board according to claim 1 further comprising coating said metal conductor pieces with a low-temperature diffusion metal.

* * * * *